US012642057B2

(12) United States Patent
Kim et al.

(10) Patent No.: US 12,642,057 B2
(45) Date of Patent: May 26, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Minki Kim, Suwon-si (KR); Seungduk Baek, Suwon-si (KR); Hyuekjae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 380 days.

(21) Appl. No.: 18/320,046

(22) Filed: May 18, 2023

(65) Prior Publication Data

US 2024/0030074 A1     Jan. 25, 2024

(30) Foreign Application Priority Data

Jul. 19, 2022     (KR) ........................ 10-2022-0089157

(51) Int. Cl.
| | |
|---|---|
| *H10P 74/00* | (2026.01) |
| *H10W 72/90* | (2026.01) |
| *H10W 90/00* | (2026.01) |
| *H10W 90/20* | (2026.01) |

(52) U.S. Cl.
CPC ........... *H10P 74/273* (2026.01); *H10W 90/00* (2026.01); *H10W 72/926* (2026.01); *H10W 72/931* (2026.01); *H10W 90/284* (2026.01)

(58) Field of Classification Search
None
See application file for complete search history.

(56) References Cited

U.S. PATENT DOCUMENTS

| | | | |
|---|---|---|---|
| 8,890,276 | B2 | 11/2014 | Chapelon |
| 9,029,183 | B2 | 5/2015 | Chen et al. |
| 9,887,155 | B2 | 2/2018 | Liu et al. |
| 11,049,776 | B2 | 6/2021 | Jung |
| 11,069,735 | B2 | 7/2021 | Kotoo et al. |
| 11,189,585 | B2 | 11/2021 | Mueller et al. |
| 2020/0006266 | A1 | 1/2020 | Chen et al. |
| 2020/0075533 | A1 | 3/2020 | Gao et al. |

FOREIGN PATENT DOCUMENTS

| | | |
|---|---|---|
| KR | 10-1474636 | 12/2014 |

*Primary Examiner* — Alexander G Ghyka
(74) *Attorney, Agent, or Firm* — Fish & Richardson P.C.

(57)     ABSTRACT

A semiconductor device includes a base structure comprising a first bonding pad and a first test pad, and a semiconductor chip comprising a second bonding pad being in contact with the first bonding pad of the base structure and a second test pad being in contact with the first test pad of the base structure. A width of the second bonding pad of the semiconductor chip is less than a width of the second test pad of the semiconductor chip. An air gap is provided between the first test pad of the base structure and the second test pad of the semiconductor chip.

12 Claims, 15 Drawing Sheets

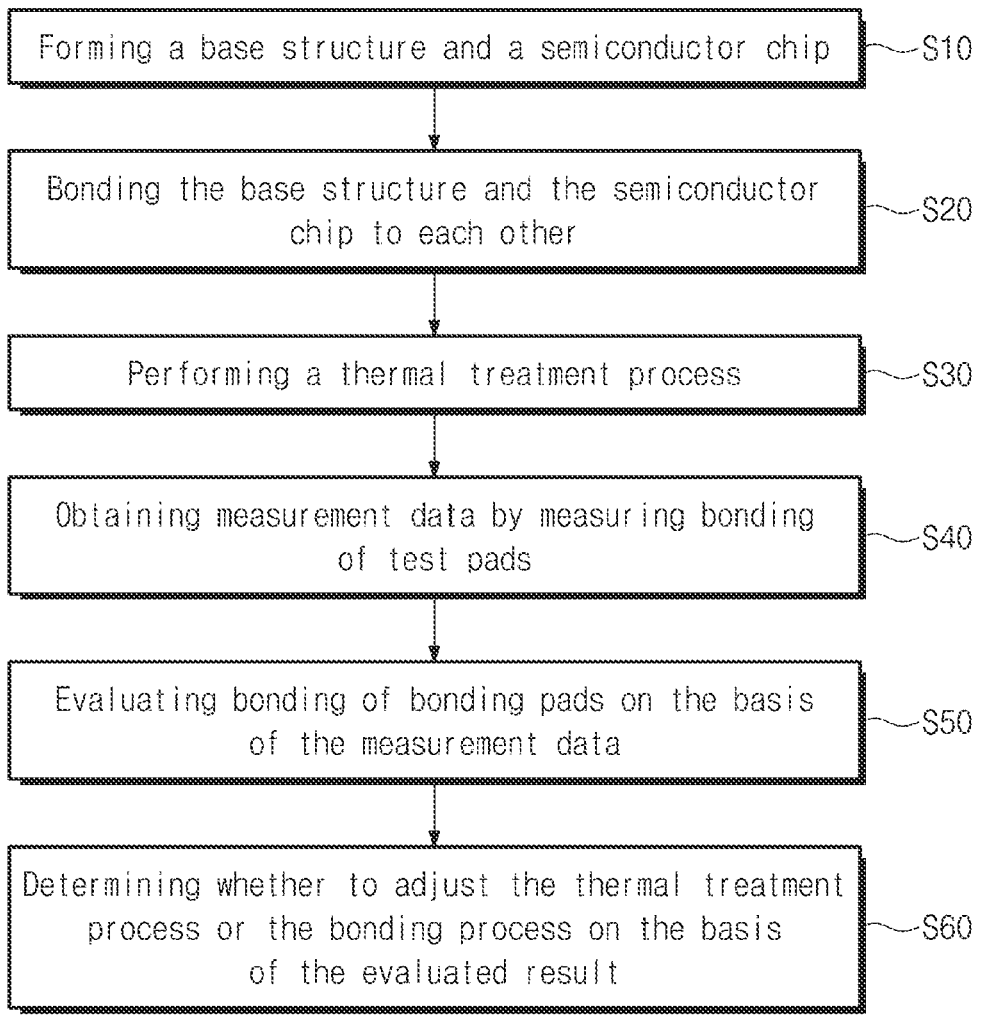

Forming a base structure and a semiconductor chip ~S10

Bonding the base structure and the semiconductor chip to each other ~S20

Performing a thermal treatment process ~S30

Obtaining measurement data by measuring bonding of test pads ~S40

Evaluating bonding of bonding pads on the basis of the measurement data ~S50

Determining whether to adjust the thermal treatment process or the bonding process on the basis of the evaluated result ~S60

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0089157, filed on Jul. 19, 2022, in the Korean Intellectual Property Office, the entire contents of which are hereby incorporated by reference.

BACKGROUND

The present disclosure relates to a semiconductor device and a method of manufacturing the same, and more particularly, to a semiconductor device including a test pad and a method of manufacturing the same.

Semiconductor devices are widely used in the electronics industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices.

As high-speed and/or low-power electronic devices have been in demand, high-speed and/or low-voltage semiconductor devices used therein have also been in demand, and highly integrated semiconductor devices have been required to satisfy these demands. However, as the integration densities of semiconductor devices increase, electrical characteristics and production yields of the semiconductor devices may be reduced. Thus, techniques for improving electrical characteristics and production yields of semiconductor devices have been variously studied.

SUMMARY

The subject matter of the present disclosure relates to a semiconductor device with improved electrical characteristics and reliability and a method of manufacturing the same. For example, in hybrid bonding technology, upper and lower chips can be connected, e.g., have no gap between, without an intermediate. However, micro-disconnections, e.g., grain non-connections, can occur. Detecting micro-disconnections between the upper and lower chips in semiconductor devices with hybrid bonding can be difficult, as the size of the micro-disconnection can depend on the test temperature. For example, at a relatively low test temperature, the lower and upper chips can have be disconnected along the entire interface of the lower and upper chips due to the lower and upper chips thermally contracting. In contrast, at a relatively high test temperature, only segments of disconnection can occur along the interface of the lower and upper chips facing each other due to the lower and upper chips thermally expanding.

A test pad, which can take the place of a normal pad for hybrid Cu bonding can be located in a chip edge or corner, where the likelihood of a micro-disconnection can be higher compared to the center of a chip, due to the force applied on each the lower and upper chips by the other tends to be greatest toward the center. The test pad can be larger than the normal pad to enhance dishing, e.g., the surfaces of the upper and lower chips that face each other forming concave surfaces. The test pad extending past the width of the lower and upper chips does not negatively impact performance of the semiconductor device.

The ability to detect micro-disconnections between upper and lower chips can facilitate remedying the micro-disconnections, which can increase the reliability and uniformity of the electrical characteristics of the semiconductor device. Additionally, the disclosed concepts advantageously do not require additional steps in the testing process, since a single testing pad can be replaced for a normal pad during a typical testing procedure.

In an aspect, a semiconductor device may include a base structure comprising a first bonding pad and a first test pad, and a semiconductor chip comprising a second bonding pad in contact with the first bonding pad of the base structure and a second test pad in contact with the first test pad of the base structure. A width of the second bonding pad of the semiconductor chip may be less than a width of the second test pad of the semiconductor chip. An air gap may be provided between the first test pad of the base structure and the second test pad of the semiconductor chip.

In an aspect, a semiconductor device may include a first insulating structure, a first bonding pad in the first insulating structure, a first test pad in the first insulating structure, a second insulating structure on the first insulating structure, a second bonding pad which is provided in the second insulating structure and is in contact with the first bonding pad, and a second test pad which is provided in the second insulating structure and is in contact with the first test pad. A width of the second bonding pad may be less than a width of the second test pad. The second test pad may have a contact surface being in contact with the first test pad, and an exposed surface spaced apart from the first test pad. The exposed surface may be closer to a side surface of the second test pad than the contact surface.

In an aspect, a semiconductor device may include a base structure comprising a first bonding pad and a first test pad, and a semiconductor chip comprising a second bonding pad being in contact with the first bonding pad of the base structure and a second test pad being in contact with the first test pad of the base structure. A width of the second bonding pad of the semiconductor chip may be less than a width of the second test pad of the semiconductor chip. A width of the first bonding pad of the base structure may be less than a width of the first test pad of the base structure. An air gap may be provided between the first test pad of the base structure and the second test pad of the semiconductor chip. The air gap may border a portion of the first test pad and a portion of the second test pad.

BRIEF DESCRIPTION OF THE DRAWINGS

FIG. 1C is an enlarged view of a region 'B' of FIG. 1B.

FIG. 2A is a flow chart illustrating a method of manufacturing an example of a semiconductor device.

DETAILED DESCRIPTION

Example implementations will now be described more fully with reference to the accompanying drawings.

Figure 1A:
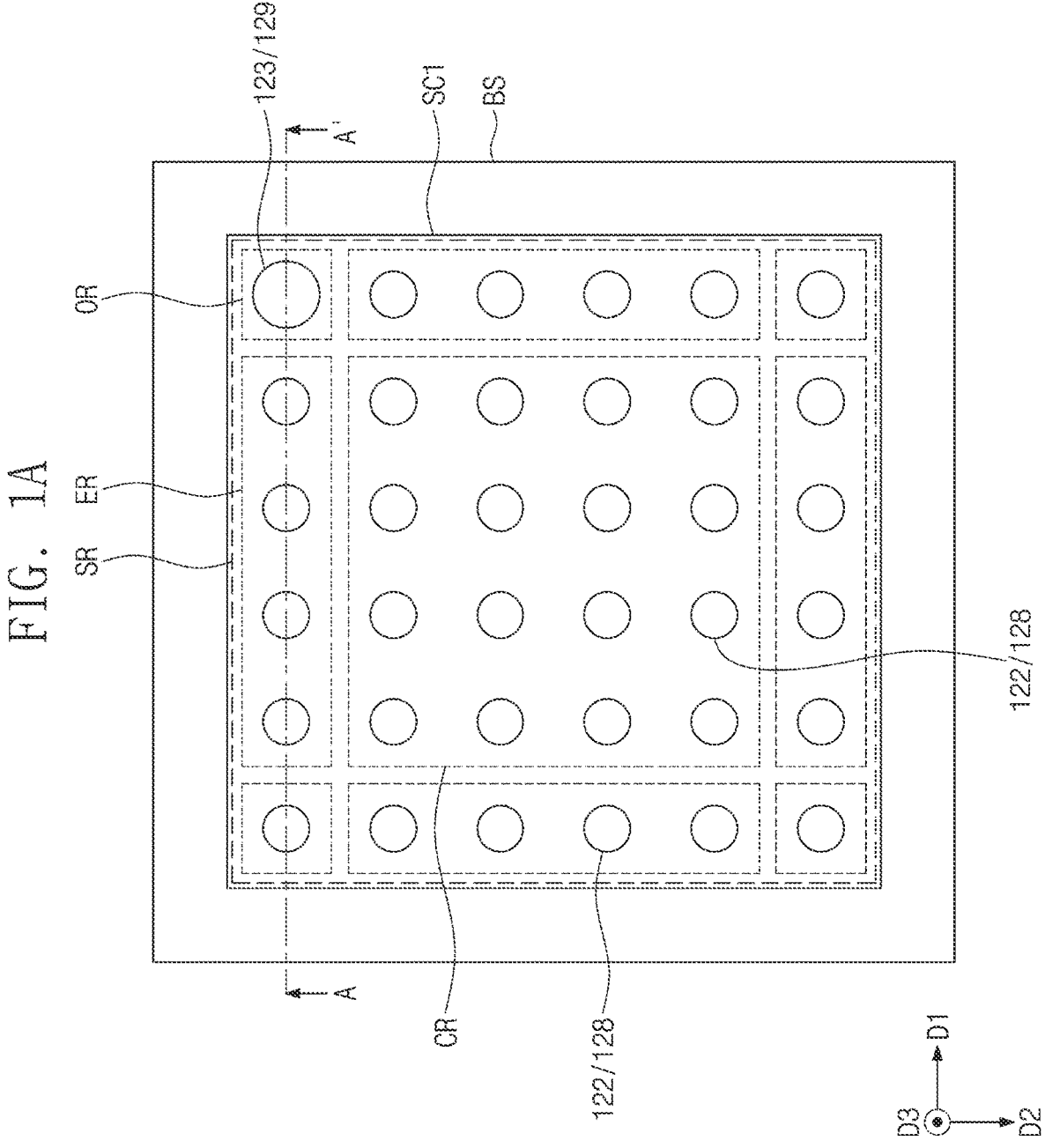
FIG. 1A is a plan view illustrating an example of a semiconductor device.
Figure 1B:
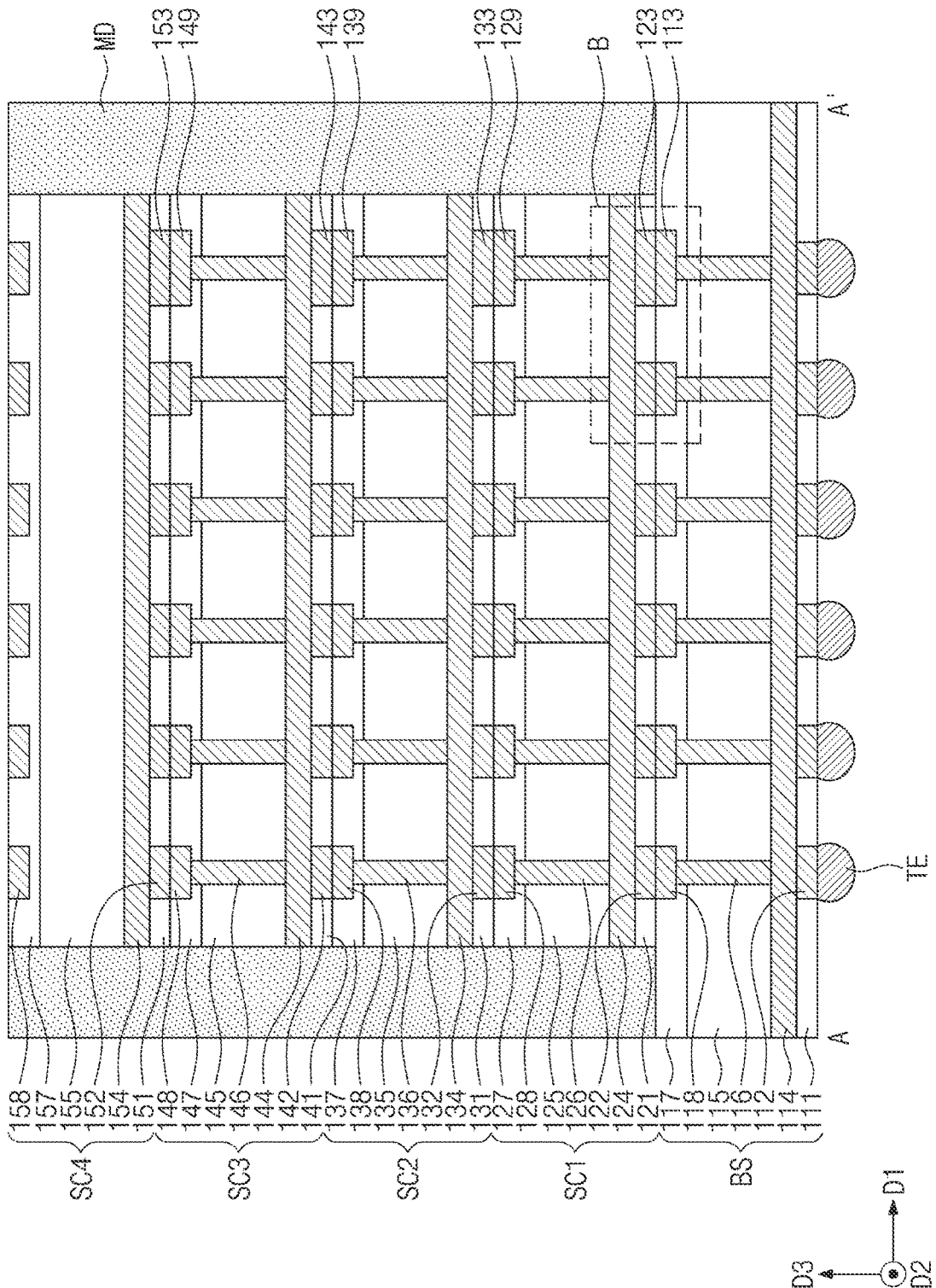
FIG. 1B is a cross-sectional view taken along a line A-A' of FIG. 1A.
Figure 1C:
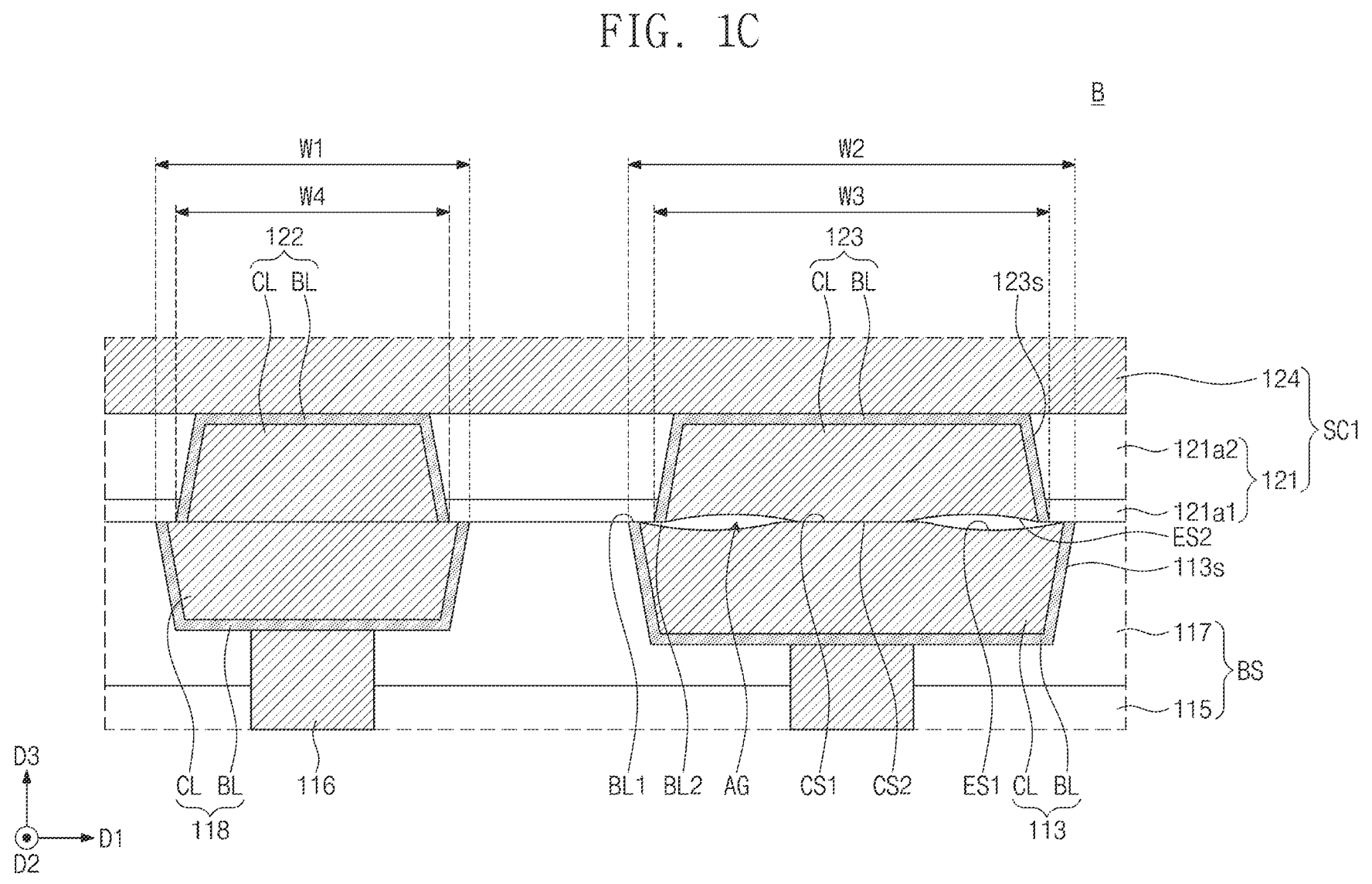

FIG. 1A is a plan view illustrating an example of a semiconductor device. FIG. 1B is a cross-sectional view taken along a line A-A' of FIG. 1A. FIG. 1C is an enlarged view of a region 'B' of FIG. 1B.

Referring to FIGS. 1A and 1B, a semiconductor device may include a base structure BS, and a first semiconductor chip SC1, a second semiconductor chip SC2, a third semiconductor chip SC3 and a fourth semiconductor chip SC4 which are sequentially stacked on the base structure BS. The number of the semiconductor chips SC1, SC2, SC3 and SC4 is four in FIG. 1B, but is not limited thereto. In some implementations, the number of the semiconductor chips SC may be eight or twelve. A molding layer MD may be disposed on the base structure BS to surround the semiconductor chips SC1, SC2, SC3 and SC4. The molding layer MD may include a polymer material. Terminals TE may be connected to the base structure BS. The semiconductor device may be electrically connected to an external device through the terminals TE. The terminals TE may include a conductive material.

The base structure BS may include a first insulating structure 111, first bonding pads 112, a first test pad 113, a first interconnection structure 114, a first substrate 115, first through-vias 116, a second insulating structure 117, and second bonding pads 118.

The first interconnection structure 114 and the first substrate 115 may be provided between the first insulating structure 111 and the second insulating structure 117. The first and second insulating structures 111 and 117 may include an insulating material. In some implementations, each of the first and second insulating structures 111 and 117 may include a plurality of insulating layers.

The first bonding pads 112 may be provided in the first insulating structure 111. The second bonding pads 118 and the first test pad 113 may be provided in the second insulating structure 117. Each of the first bonding pads 112 may be connected to each of the terminals TE. The first bonding pads 112, the second bonding pads 118 and the first test pad 113 may include a conductive material.

The first interconnection structure 114 may be provided on the first insulating structure 111. The first interconnection structure 114 may be connected to the first bonding pads 112. The first interconnection structure 114 may include a conductive structure and an insulating layer surrounding the conductive structure. The conductive structure of the first interconnection structure 114 may include at least one of a conductive contact, a conductive line, or a conductive pad. The conductive structure of the first interconnection structure 114 may be electrically connected to the first bonding pad 112. In some implementations, the first interconnection structure 114 may include a plurality of insulating layers.

The base structure BS may include a semiconductor element. For example. the base structure BS may include a logic element. The semiconductor element of the base structure BS may be provided between the first substrate 115 and the first interconnection structure 114. The semiconductor element may be electrically connected to the conductive structure of the first interconnection structure 114. In some implementations, the base structure BS may be a redistribution substrate or printed circuit board not including the semiconductor element.

The first substrate 115 may be provided on the first interconnection structure 114. The first substrate 115 may have a plate-shape extending along a plane extending in a first direction D1 and a second direction D2. The first direction D1 and the second direction D2 may intersect each other. For example, the first direction D1 and the second direction D2 may be horizontal directions perpendicular to each other. In some implementations, the first substrate 115 may be a semiconductor substrate. For example, the first substrate 115 may include silicon, germanium, silicon-germanium, GaP, or GaAs. In some implementations, the first substrate 115 may be a silicon-on-insulator (SOI) substrate or a germanium-on-insulator (GOI) substrate.

The first through-vias 116 may penetrate the first substrate 115. The first through-vias 116 may extend in a third direction D3. The third direction D3 may intersect the first direction D1 and the second direction D2. For example, the third direction D3 may be a vertical direction perpendicular to the first direction D1 and the second direction D2.

The first through-via 116 may be electrically connected to the conductive structure of the first interconnection structure 114. The first through-via 116 may be connected to the second bonding pad 118 or the first test pad 113. The first through-vias 116 may include a conductive material.

Components of the first to fourth semiconductor chips SC1, SC2, SC3 and SC4 may be similar to the components of the base structure BS.

The first semiconductor chip SC1 may include a third insulating structure 121, third bonding pads 122, a second test pad 123, a second interconnection structure 124, a second substrate 125, second through-vias 126, a fourth insulating structure 127, fourth bonding pads 128, and a third test pad 129.

The third bonding pads 122 and the second test pad 123 may be provided in the third insulating structure 121. The fourth bonding pads 128 and the third test pad 129 may be provided in the fourth insulating structure 127.

The third insulating structure 121 of the first semiconductor chip SC1 may be in contact with the second insulating structure 117 of the base structure BS. The third bonding pad 122 of the first semiconductor chip SC1 may be in contact with the second bonding pad 118 of the base structure BS. The second test pad 123 of the first semiconductor chip SC1 may be in contact with the first test pad 113 of the base structure BS.

The second semiconductor chip SC2 may include a fifth insulating structure 131, fifth bonding pads 132, a fourth test pad 133, a third interconnection structure 134, a third substrate 135, third through-vias 136, a sixth insulating structure 137, sixth bonding pads 138, and a fifth test pad 139.

The fifth insulating structure 131 of the second semiconductor chip SC2 may be in contact with the fourth insulating structure 127 of the first semiconductor chip SC1. The fifth bonding pad 132 of the second semiconductor chip SC2 may be in contact with the fourth bonding pad 128 of the first semiconductor chip SC1. The fourth test pad 133 of the second semiconductor chip SC2 may be in contact with the third test pad 129 of the first semiconductor chip SC1.

The third semiconductor chip SC3 may include a seventh insulating structure 141, seventh bonding pads 142, a sixth test pad 143, a fourth interconnection structure 144, a fourth substrate 145, fourth through-vias 146, an eighth insulating structure 147, eighth bonding pads 148, and a seventh test pad 149.

The fourth semiconductor chip SC4 may include a ninth insulating structure 151, ninth bonding pads 152, an eighth test pad 153, a fifth interconnection structure 154, a fifth substrate 155, a tenth insulating structure 157, and tenth bonding pads 158. The uppermost one (i.e., the fourth semiconductor chip SC4) of the first to fourth semiconductor chips SC1, SC2, SC3 and SC4 may not include a through-via. The fourth semiconductor chip SC4 may not include a test pad in the tenth insulating structure 157.

The first semiconductor chip SC1 may include a center region CR and a surrounding region SR surrounding the center region CR. The center region CR and the surrounding region SR may be regions defined or divided in a plan view defined by the first direction D1 and the second direction D2. The surrounding region SR may be closer to a side surface of the first semiconductor chip SC1 than the center region CR.

The surrounding region SR may include corner regions OR and edge regions ER. The corner region OR may be a region adjacent to a portion at which side surfaces of the first semiconductor chip SC1 are connected to each other. The edge region ER may be a region disposed between two corner regions OR.

The second test pad 123 and the third test pad 129 of the first semiconductor chip SC1 may be disposed in the corner region OR of the first semiconductor chip SC1. Each of the third bonding pads 122 and the fourth bonding pads 128 of the first semiconductor chip SC1 may be disposed in the center region CR, the corner region OR or the edge region ER of the first semiconductor chip SC1.

The second test pad 123 and the third test pad 129 of the first semiconductor chip SC1 may be closer to the side surface of the first semiconductor chip SC1 than some of the third bonding pads 122 and the fourth bonding pads 128 of the first semiconductor chip SC1.

Like the first semiconductor chip SC1, the first test pad 113 of the base structure BS may be disposed in a corner region of the base structure BS, and each of the test pads 133, 139, 143, 149 and 153 of the second to fourth semiconductor chips SC2, SC3 and SC4 may be disposed in a corner region of each of the second to fourth semiconductor chips SC2, SC3 and SC4.

Referring to FIG. 1C, the second insulating structure 117 of the base structure BS may include a plurality of insulating layers. For example, the second insulating structure 117 may include a silicon nitride layer and a silicon oxide layer.

The third insulating structure 121 of the first semiconductor chip SC1 may include a first insulating layer 121a1 being in contact with the second insulating structure 117, and a second insulating layer 121a2 on the first insulating layer 121al. For example, the first insulating layer 121a1 may be a silicon carbonitride layer. The second insulating layer 121a2 may include a plurality of insulating layers. For example, the second insulating layer 121a2 may include a silicon nitride layer and a silicon oxide layer.

A width of the second bonding pad 118 may be less than a width of the first test pad 113 and a width of the second test pad 123. For example, a maximum width W1 of the second bonding pad 118 in the first direction D1 may be less than a maximum width W2 of the first test pad 113 in the first direction D1 and a maximum width W3 of the second test pad 123 in the first direction D1. For example, the width of the first test pad 113 may be greater than 1.1 times the width of the second bonding pad 118. Throughout this disclosure, "width" can refer to a length along a horizontal direction, e.g., direction D1.

A width of the third bonding pad 122 may be less than the width of the first test pad 113 and the width of the second test pad 123. For example, a maximum width W4 of the third bonding pad 122 in the first direction D1 may be less than the maximum width W2 of the first test pad 113 in the first direction D1 and the maximum width W3 of the second test pad 123 in the first direction D1. For example, the width of the second test pad 123 may be greater than 1.1 times of the width of the third bonding pad 122.

As described above, widths of the bonding pads 122, 128, 132, 138, 142, 148 and 152 of the semiconductor chips SC1, SC2, SC3 and SC4 may be less than widths of the test pads 113, 123, 129, 133, 139, 143, 149 and 153.

Each of the first to tenth bonding pads 112, 118, 122, 128, 132, 138, 142, 148, 152 and 158 and the first to eighth test pads 113, 123, 129, 133, 139, 143, 149 and 153 may include a conductive layer CL and a barrier layer BL. The barrier layer BL may surround the conductive layer CL. The conductive layer CL may include, for example, copper, and the barrier layer BL may include, for example, titanium, tantalum, titanium oxide, tantalum oxide, titanium nitride, tantalum nitride, or a combination thereof.

The width of the second bonding pad 118 may be greater than the width of the third bonding pad 122, and the whole of a bottom surface of the third bonding pad 122 may be in contact with a top surface of the second bonding pad 118. The whole of a bottom surface of the conductive layer CL of the third bonding pad 122 and the whole of a bottom surface of the barrier layer BL of the third bonding pad 122 may be in contact with a top surface of the conductive layer CL of the second bonding pad 118. The top surface of the second bonding pad 118 may be flat, and the bottom surface of the third bonding pad 122 may be flat. In some implementations, the width of the third bonding pad 122 may be greater than the width of the second bonding pad 118, and the whole of the top surface of the second bonding pad 118 may be in contact with the bottom surface of the third bonding pad 122. In some implementations, a portion of the bottom surface of the third bonding pad 122 may be in contact with a portion of the top surface of the second bonding pad 118.

An air gap AG may be provided between the first test pad 113 and the second test pad 123 which are in contact with each other. The width of the first test pad 113 may be greater than the width of the second test pad 123, and the air gap AG may expose a top surface of the first test pad 113, a bottom surface of the second test pad 123, and a bottom surface of the third insulating structure 121. In some implementations, the width of the second test pad 123 may be greater than the width of the first test pad 113, and the air gap AG may expose the top surface of the first test pad 113, the bottom surface of the second test pad 123, and a top surface of the second insulating structure 117. In some implementations, the air gap AG may expose the top surface of the first test pad 113, the bottom surface of the second test pad 123, the top surface of the second insulating structure 117, and the bottom surface of the third insulating structure 121.

The conductive layer CL of the first test pad 113 may have a first contact surface CS1 being in contact with the conductive layer CL of the second test pad 123. The conductive layer CL of the second test pad 123 may have a second contact surface CS2 being in contact with the first contact surface CS1 of the conductive layer CL of the first test pad 113. The first contact surface CS1 and the second contact surface CS2 may be flat. The first contact surface CS1 may be a central portion of a top surface of the conductive layer CL of the first test pad 113. The second contact surface CS2 may be a central portion of a bottom surface of the conductive layer CL of the second test pad 123.

The air gap AG may border a portion of the first test pad 113 and a portion of the second test pad 123. The air gap AG may border the first contact surface CS1 and the second contact surface CS2. The air gap AG may have a ring shape. At least a portion of the air gap AG may be provided between the first contact surface CS1 and a side surface 113s of the first test pad 113. At least a portion of the air gap AG may be provided between the second contact surface CS2 and a side surface 123s of the second test pad 123.

A height of an uppermost portion of the air gap AG may be higher than a height of the first and second contact surfaces CS1 and CS2. A height of a lowermost portion of the air gap AG may be lower than the height of the first and second contact surfaces CS1 and CS2. Throughout this disclosure, "height" can refer to a length along a vertical direction, e.g., third direction D3.

The conductive layer CL of the first test pad 113 may have a first exposed surface ES1 exposed by the air gap AG. The conductive layer CL of the second test pad 123 may have a second exposed surface ES2 exposed by the air gap AG. The first exposed surface ES1 and the second exposed surface ES2 may be curved. The first exposed surface ES1 may be provided between the first contact surface CS1 and the side surface 113s of the first test pad 113. The second exposed surface ES2 may be provided between the second contact surface CS2 and the side surface 123s of the second test pad 123. The first exposed surface ES1 and the second exposed surface ES2 may define the air gap AG.

A top surface BL1 of the barrier layer BL of the first test pad 113 may be flat. The top surface BL1 of the barrier layer BL of the first test pad 113 may be in contact with the third insulating structure 121. A bottom surface BL2 of the barrier layer BL of the second test pad 123 may be flat. The bottom surface BL2 of the barrier layer BL of the second test pad 123 may be exposed by the air gap AG. The bottom surface BL2 of the barrier layer BL of the second test pad 123 may be spaced apart from the first test pad 113.

A structure of the third and fourth test pads 129 and 133 being in contact with each other, a structure of the fifth and sixth test pads 139 and 143 being in contact with each other and a structure of the seventh and eighth test pads 149 and 153 being in contact with each other may be similar to the structure of the first and second test pads 113 and 123 described with reference to FIG. 1C.

The bonding pads 112, 118, 122, 128, 132, 138, 142, 148, 152 and 158 may be pads providing electrical connection for driving the semiconductor device. The test pads 113, 123, 129, 133, 139, 143, 149 and 153 may be pads for testing bonding processes of the bonding pads 118, 122, 128, 132, 138, 142, 148 and 152.

The semiconductor device may include the test pads 113, 123, 129, 133, 139, 143, 149 and 153 having relatively great widths, and thus bonding quality of the bonding pads 118, 122, 128, 132, 138, 142, 148 and 152 may be improved.

In the semiconductor device, the test pads 113, 123, 129, 133, 139, 143, 149 and 153 may be disposed in the corner regions OR, and thus the bonding quality of the bonding pads 118, 122, 128, 132, 138, 142, 148 and 152 may be improved.

Figure 2B:
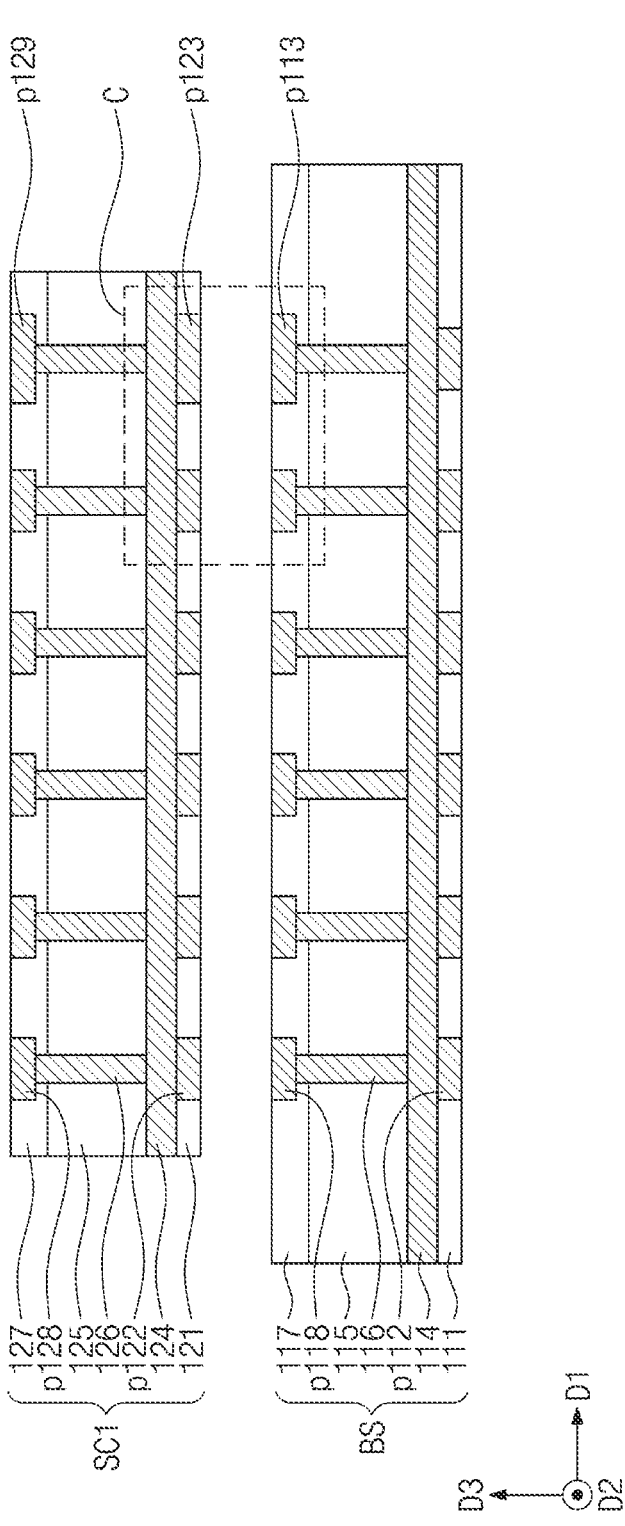
FIG. 2B is a cross-sectional view illustrating a method of manufacturing an example of a semiconductor device.
Figure 2C:
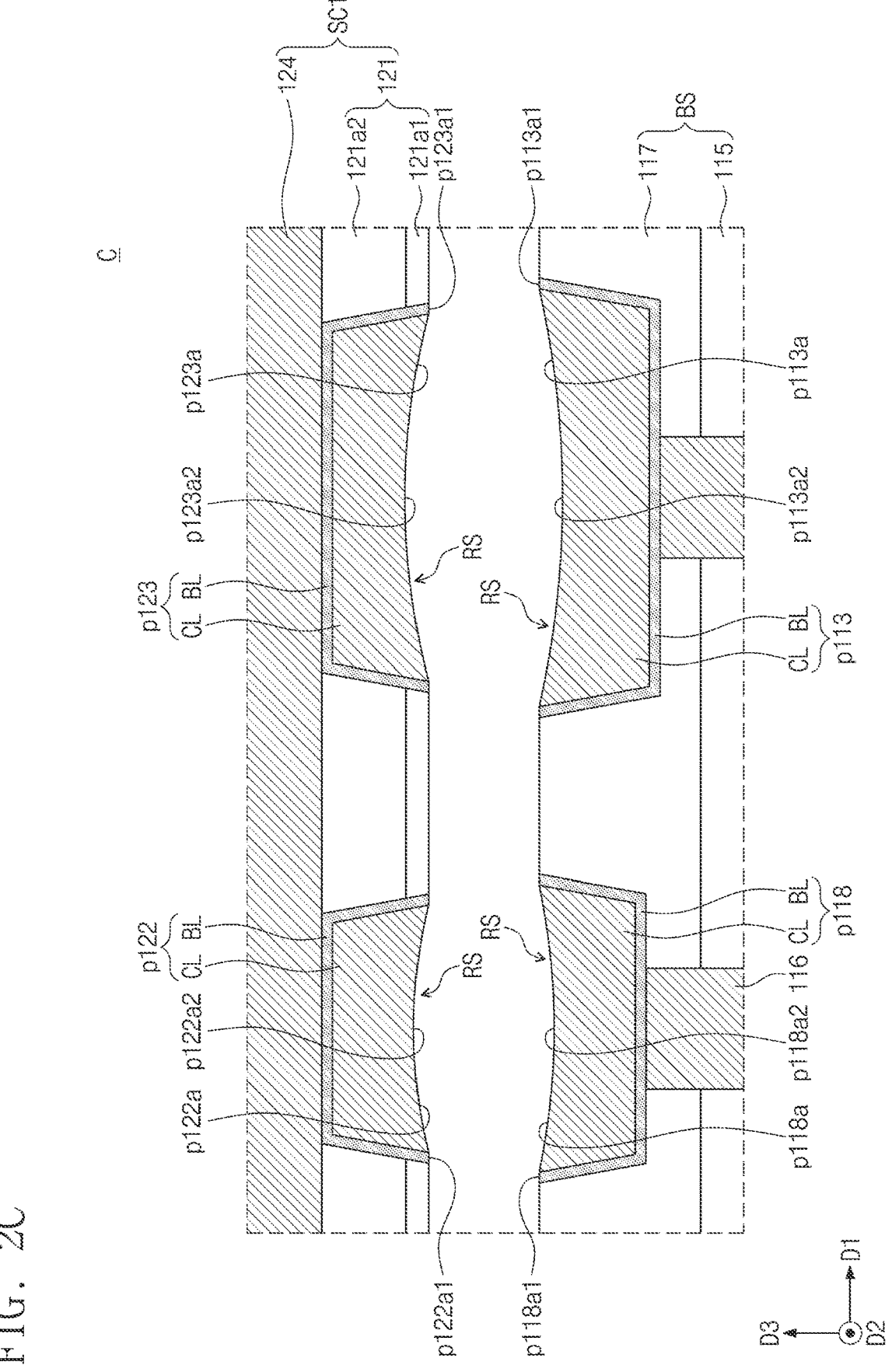
FIG. 2C is an enlarged view of a region 'C' of FIG. 2B.

FIG. 2A is a flow chart illustrating a method of manufacturing an example of a semiconductor device. FIG. 2B is a cross-sectional view illustrating a method of manufacturing a semiconductor device. FIG. 2C is an enlarged view of a region 'C' of FIG. 2B.

Referring to FIG. 2A, a method of manufacturing a semiconductor device may include forming a base structure and a semiconductor chip (S10), bonding the base structure and the semiconductor chip to each other (S20), performing a thermal treatment process (S30), obtaining measurement data by measuring bonding of test pads (S40), evaluating bonding of bonding pads on the basis of the measurement data (S50), and determining whether to adjust the thermal treatment process or the bonding process on the basis of the evaluated result (S60).

Referring to FIGS. 2A, 2B and 2C, a base structure BS and a first semiconductor chip SC1 may be formed (S10). The formation of the base structure BS may include forming a first interconnection structure 114 on a first substrate 115, forming first through-vias 116 penetrating the first substrate 115, forming a first insulating structure 111 on the first interconnection structure 114, forming first preliminary bonding pads p112 in the first insulating structure 111, forming a second insulating structure 117 on the first substrate 115, and forming second preliminary bonding pads p118 and a first preliminary test pad p113 in the second insulating structure 117.

The formation of the first preliminary bonding pads p112 may include etching the first insulating structure 111, forming a barrier layer BL in the first insulating structure 111, forming a first conductive material layer on the first insulating structure 111, and performing a first polishing process to polish the first conductive material layer.

The formation of the second preliminary bonding pads p118 and the first preliminary test pad p113 may include etching the second insulating structure 117, forming a barrier layer BL in the second insulating structure 117, forming a second conductive material layer on the second insulating structure 117, and performing a second polishing process to polish the second conductive material layer.

A conductive layer CL of each of the first preliminary bonding pads p112, the second preliminary bonding pads p118 and the first preliminary test pad p113 may be formed by the first or second polishing process. A recess RS may be formed in each of the conductive layers CL of the first preliminary bonding pads p112, the second preliminary bonding pads p118 and the first preliminary test pad p113, formed by the first and second polishing processes.

A width of the first preliminary test pad p113 may be greater than a width of each of the first and second preliminary bonding pads p112 and p118, and thus the recess RS formed in the conductive layer CL of the first preliminary test pad p113 may be greater than the recess RS formed in each of the conductive layers CL of the first and second preliminary bonding pads p112 and p118.

For example, the recess RS of the first preliminary test pad p113 may be greater than the recess RS of the second preliminary bonding pad p118. A height difference between an uppermost portion p118$a1$ and a lowermost portion p118$a2$ of atop surface p118$a$ of the second preliminary bonding pad p118 may be less than a height difference between an uppermost portion p113a1 and a lowermost portion p113a2 of a top surface p113a of the first preliminary test pad p113. A height of the recess RS of the second preliminary bonding pad p118 may be less than a height of the recess RS of the first preliminary test pad p113. A height of the uppermost portion p118a1 of the top surface p118a of the second preliminary bonding pad p118 may be the same as a height of the uppermost portion p113a1 of the top surface p113a of the first preliminary test pad p113. A height of the lowermost portion p113a2 of the top surface p113a of the first preliminary test pad p113 may be lower than a height of the lowermost portion p118a2 of the top surface p118a of the second preliminary bonding pad p118.

The uppermost portion p118a1 of the top surface p118a of the second preliminary bonding pad p118 may be a top surface of the barrier layer BL of the second preliminary bonding pad p118. The lowermost portion p118a2 of the top surface p118a of the second preliminary bonding pad p118 may be a portion of a top surface of the conductive layer CL of the second preliminary bonding pad p118.

The uppermost portion p113a1 of the top surface p113a of the first preliminary test pad p113 may be a top surface of the barrier layer BL of the first preliminary test pad p113. The lowermost portion p113a2 of the top surface p113a of the first preliminary test pad p113 may be a portion of a top surface of the conductive layer CL of the first preliminary test pad p113.

The first semiconductor chip SC1 may be formed using processes similar to the processes of forming the base structure BS. The first semiconductor chip SC1 may include a second substrate 125, a second interconnection structure 124, second through-vias 126, a third insulating structure 121, third preliminary bonding pads p122, a second preliminary test pad p123, a fourth insulating structure 127, fourth preliminary bonding pads p128, and a third preliminary test pad p129.

A width of each of the second and third preliminary test pads p123 and p129 may be greater than a width of each of the third and fourth preliminary bonding pads p122 and p128, and thus a recess RS formed in each of the second and third preliminary test pads p123 and p129 may be greater than a recess RS formed in each of the third and fourth preliminary bonding pads p122 and p128.

For example, the recess RS of the second preliminary test pad p123 may be greater than the recess RS of the third preliminary bonding pad p122. A height difference between a lowermost portion p122a1 and an uppermost portion p122a2 of a bottom surface p122a of the third preliminary bonding pad p122 may be less than a height difference between a lowermost portion p123a1 and an uppermost portion p123a2 of a bottom surface p123a of the second preliminary test pad p123. A height of the recess RS of the third preliminary bonding pad p122 may be less than a height of the recess RS of the second preliminary test pad p123. A height of the lowermost portion p122a1 of the bottom surface p122a of the third preliminary bonding pad p122 may be the same as a height of the lowermost portion p123a1 of the bottom surface p123a of the second preliminary test pad p123. A height of the uppermost portion p123a2 of the bottom surface p123a of the second preliminary test pad p123 may be higher than a height of the uppermost portion p122a2 of the bottom surface p122a of the third preliminary bonding pad p122.

The lowermost portion p122a1 of the bottom surface p122a of the third preliminary bonding pad p122 may be a bottom surface of the barrier layer BL of the third preliminary bonding pad p122. The uppermost portion p122a2 of the bottom surface p122a of the third preliminary bonding pad p122 may be a portion of a bottom surface of the conductive layer CL of the third preliminary bonding pad p122.

The lowermost portion p123a1 of the bottom surface p123a of the second preliminary test pad p123 may be a bottom surface of the barrier layer BL of the second preliminary test pad p123. The uppermost portion p123a2 of the bottom surface p123a of the second preliminary test pad p123 may be a portion of a bottom surface of the conductive layer CL of the second preliminary test pad p123.

Referring to FIGS. 2A, 1B and 1C, the base structure BS and the first semiconductor chip SC1 may be bonded to each other (S20). The bonding of the base structure BS and the first semiconductor chip SC1 may include pressing the first semiconductor chip SC1 and the base structure BS by using a pressing apparatus. In some implementations, the pressing force may be relatively high at central portions of the base structure BS and the first semiconductor chip SC1.

Since the base structure BS is bonded to the first semiconductor chip SC1, the second insulating structure 117 may be bonded to the third insulating structure 121, the second preliminary bonding pad p118 may be bonded to the third preliminary bonding pad p122, and the first preliminary test pad p113 may be bonded to the second preliminary test pad p123. The recesses RS may be provided between the second preliminary bonding pad p118 and the third preliminary bonding pad p122, and the recesses RS may be provided between the first preliminary test pad p113 and the second preliminary test pad p123.

Second to fourth semiconductor chips SC2, SC3 and SC4 may be formed like the first semiconductor chip SC1, the second semiconductor chip SC2 may be bonded to the first semiconductor chip SC1, the third semiconductor chip SC3 may be bonded to the second semiconductor chip SC2, and the fourth semiconductor chip SC4 may be bonded to the third semiconductor chip SC3.

The thermal treatment process may be performed (S30). The second and third preliminary bonding pads p118 and p122 bonded to each other may increase in size by the thermal treatment process, and thus second and third bonding pads 118 and 122 may be formed. Since the second and third preliminary bonding pads p118 and p122 increase in size, the recesses RS between the second and third preliminary bonding pads p118 and p122 may be completely filled with the second and third bonding pads 118 and 122.

The first and second preliminary test pads p113 and p123 bonded to each other may increase in size by the thermal treatment process, and thus first and second test pads 113 and 123 may be formed. Since the first and second preliminary test pads p113 and p123 increase in size, an air gap AG may be formed between the first and second test pads 113 and 123. A first contact surface CS1 being in contact with the second test pad 123 may be formed at the first test pad 113, and a second contact surface CS2 being in contact with the first test pad 113 may be formed at the second test pad 123. The recesses RS between the first and second preliminary test pads p113 and p123 may be partially filled with the first and second test pads 113 and 123.

Other bonding pads 128, 132, 138, 142, 148 and 152 and other test pads 129, 133, 139, 143, 149 and 153 may be formed like the second and third bonding pads 118 and 122 and the first and second test pads 113 and 123.

Terminals TE connected to the first preliminary bonding pads p112 may be formed. The first preliminary bonding pads p112 connected to the terminals TE may be defined as first bonding pads 112. A molding layer MD may be formed to surround the first to fourth semiconductor chips SC1, SC2, SC3 and SC4. A semiconductor device may be manufactured by the processes described above.

Measurement data may be obtained by measuring bonding of the test pads 113, 123, 129, 133, 139, 143, 149 and 153 of the semiconductor device (S40). The measuring of the bonding of the test pads 113, 123, 129, 133, 139, 143, 149 and 153 may include measuring electrical connection of the test pads 113 and 123, 129 and 133, 139 and 143 or 149 and 153 being in contact with each other, or measuring a size of the air gap AG provided between the test pads 113 and 123, 129 and 133, 139 and 143 or 149 and 153 being in contact with each other. For example, the measuring of the electrical connection of the test pads 113 and 123, 129 and 133, 139 and 143 or 149 and 153 being in contact with each other may include measuring the flow of a current between the test pads 113 and 123, 129 and 133, 139 and 143 or 149 and 153 being in contact with each other.

The measurement data obtained by measuring the bonding of the test pads 113, 123, 129, 133, 139, 143, 149 and 153 may be stored. For example, a magnitude of a current flowing between the first test pad 113 and the second test pad 123 may be stored as the measurement data. For example, a size of the air gap AG between the first test pad 113 and the second test pad 123 may be stored as the measurement data. For example, the measurement data may be stored in a storage device such as a server.

Bonding between pairs of the bonding pads 118 and 122, 128 and 132, 138 and 142 or 148 and 152 being in contact with each other may be evaluated on the basis of the measurement data, and an evaluated result may be obtained (S50). The evaluated result may be determined as 'pass' or 'fail'. When the measurement data meets a predetermined reference, the evaluated result may be determined as a pass. When the measurement data is less than the predetermined reference, the evaluated result may be determined as a fail.

For example, when the magnitude of the current between the first test pad 113 and the second test pad 123 by a certain voltage is equal to or greater than a predetermined value, it may be evaluated that bonding quality of the bonding pads 118, 122, 128, 132, 138, 142, 148 and 152 is secured, and the evaluated result may be determined as a pass. For example, when the magnitude of the current between the first test pad 113 and the second test pad 123 by the certain voltage is less than the predetermined value, it may be evaluated that the bonding quality of the bonding pads 118, 122, 128, 132, 138, 142, 148 and 152 is not secured, and the evaluated result may be determined as a fail.

Whether to adjust the thermal treatment process or the bonding process may be determined on the basis of the evaluated result of the bonding of the bonding pads 118, 122, 128, 132, 138, 142, 148 and 152 (S60). When the evaluated result of the bonding of the bonding pads 118, 122, 128, 132, 138, 142, 148 and 152 is a fail, the thermal treatment process or the bonding process may be adjusted. For example, a temperature of the thermal treatment process may be increased, or a time of the thermal treatment process may be increased. For example, the pressing force of the bonding process may be increased. When the evaluated result of the bonding of the bonding pads 118, 122, 128, 132, 138, 142, 148 and 152 is a fail, subsequent semiconductor devices may be manufactured using the adjusted thermal treatment process or bonding process.

When the evaluated result of the bonding of the bonding pads 118, 122, 128, 132, 138, 142, 148 and 152 is a pass, subsequent semiconductor devices may be manufactured without adjusting the thermal treatment process or the bonding process.

The method of manufacturing a semiconductor device may include evaluating the bonding of the bonding pads using the data obtained by measuring the bonding of the test pads having relatively great widths, and thus a process condition allowing the bonding pads to have improved bonding quality may be obtained.

The method of manufacturing a semiconductor device may include evaluating the bonding of the bonding pads using the data obtained by measuring the bonding of the test pads located in the corner region to which relatively weak pressing force is applied, and thus a process condition allowing the bonding pads to have improved bonding quality may be obtained.

Figure 3:
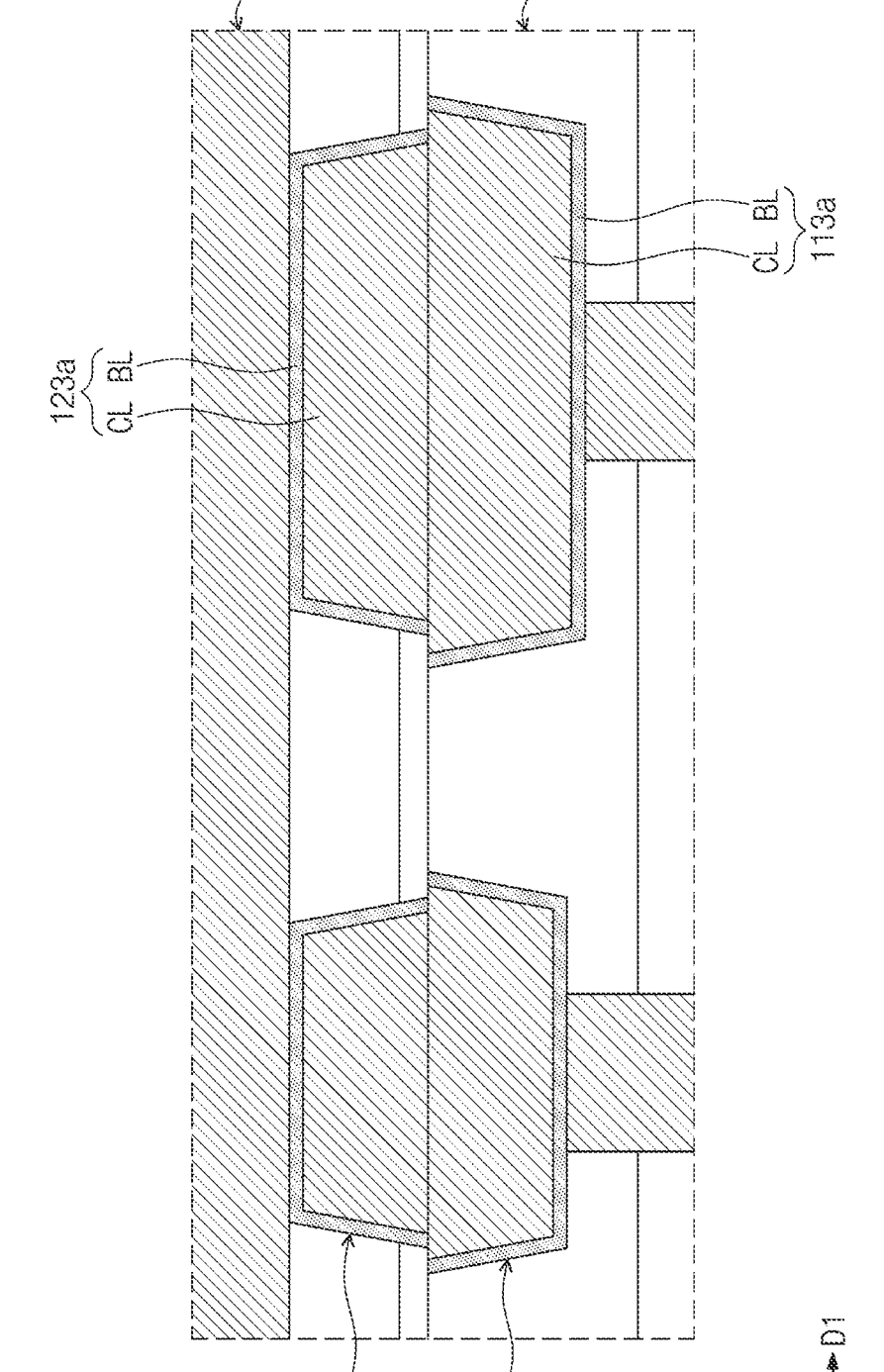
FIG. 3 is a cross-sectional view illustrating an example of a semiconductor device.

FIG. 3 is a cross-sectional view illustrating an example of a semiconductor device.

Referring to FIG. 3, a semiconductor device may include a base structure BSa and a first semiconductor chip SC1a on the base structure BSa.

The base structure BSa may include a first bonding pad 118a and a first test pad 113a. The first semiconductor chip SC1a may include a second bonding pad 122a in contact with the first bonding pad 118a, and a second test pad 123a in contact with the first test pad 113a.

A width of the first test pad 113a may be greater than a width of the second test pad 123a, and the whole of a bottom surface of the second test pad 123a may be in contact with a top surface of the first test pad 113a. The whole of a bottom surface of a conductive layer CL of the second test pad 123a and the whole of a bottom surface of a barrier layer BL of the second test pad 123a may be in contact with a top surface of a conductive layer CL of the first test pad 113a. An air gap may not be formed between the first test pad 113a and the second test pad 123a. The top surface of the first test pad 113a and the bottom surface of the second test pad 123a may be flat.

In some implementations, the width of the second test pad 123a may be greater than the width of the first test pad 113a, and the whole of the top surface of the first test pad 113a may be in contact with the bottom surface of the second test pad 123a. In some implementations, a portion of the bottom surface of the second test pad 123a may be in contact with a portion of the top surface of the first test pad 113a.

Figure 4:
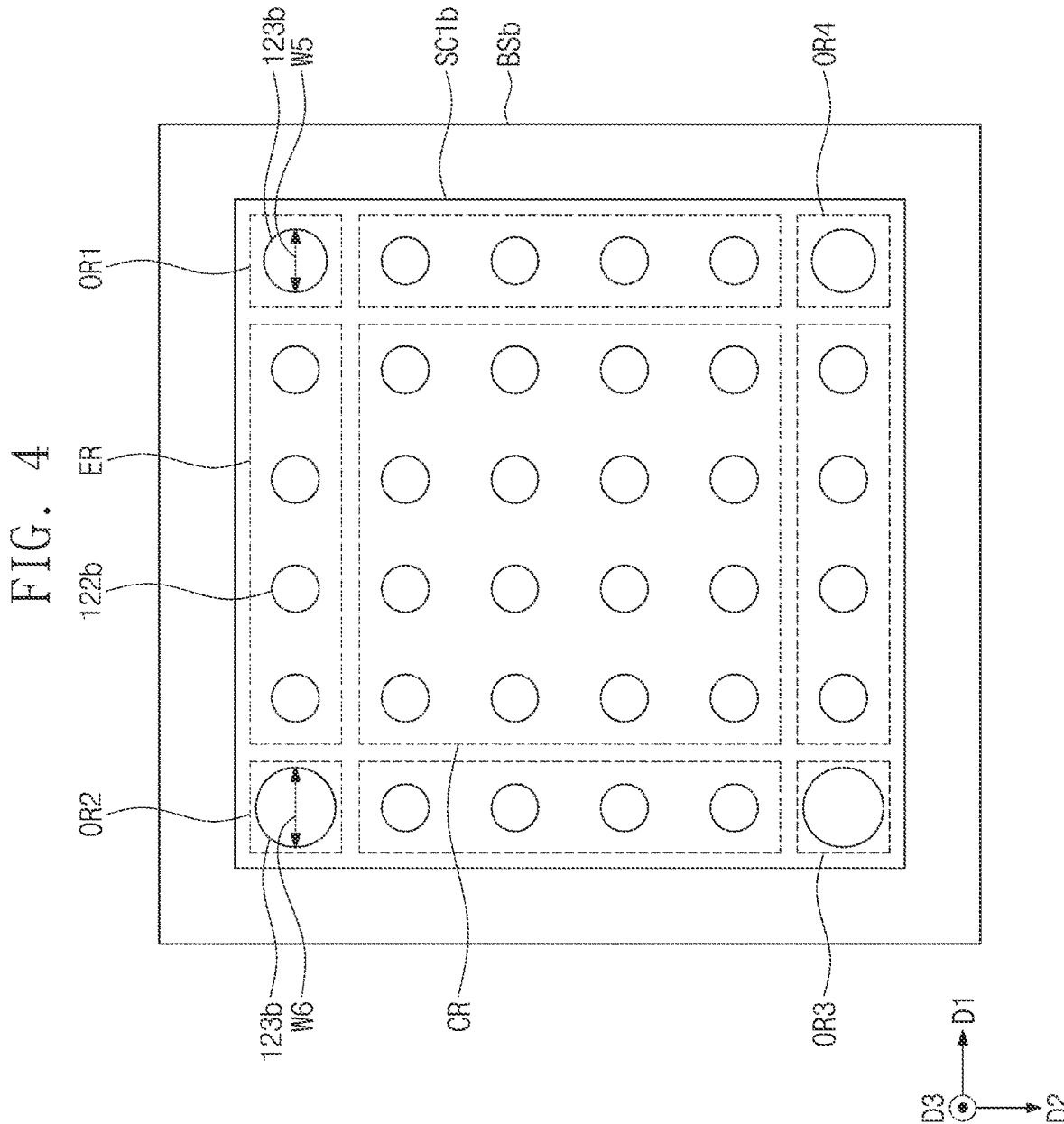
FIG. 4 is a plan view illustrating an example of a semiconductor device.

FIG. 4 is a plan view illustrating an example of a semiconductor device.

Referring to FIG. 4, a semiconductor device may include a base structure BSb and a first semiconductor chip SC1b on the base structure BSb.

The first semiconductor chip SC1b may include first to fourth corner regions OR1, OR2, OR3 and OR4, edge regions ER, and a center region CR. The first semiconductor chip SC1b may include bonding pads 122b disposed in the center region CR and the edge regions ER, and test pads 123b disposed in the first to fourth corner regions OR1, OR2, OR3 and OR4.

A width of the test pad 123b disposed in the first corner region OR1 may be different from a width of the test pad 123b disposed in the second corner region OR2. For example, a maximum width W5, in the first direction D1, of the test pad 123b disposed in the first corner region OR1 may be less than a maximum width W6, in the first direction D1, of the test pad 123b disposed in the second corner region OR2. The widths of the test pads 123b may be greater than widths of the bonding pads 122b.

The base structure BSb may include bonding pads and test pads, which are disposed at positions corresponding to positions of the bonding pads 122b and the test pads 123b of the first semiconductor chip SC1b.

Figure 5:
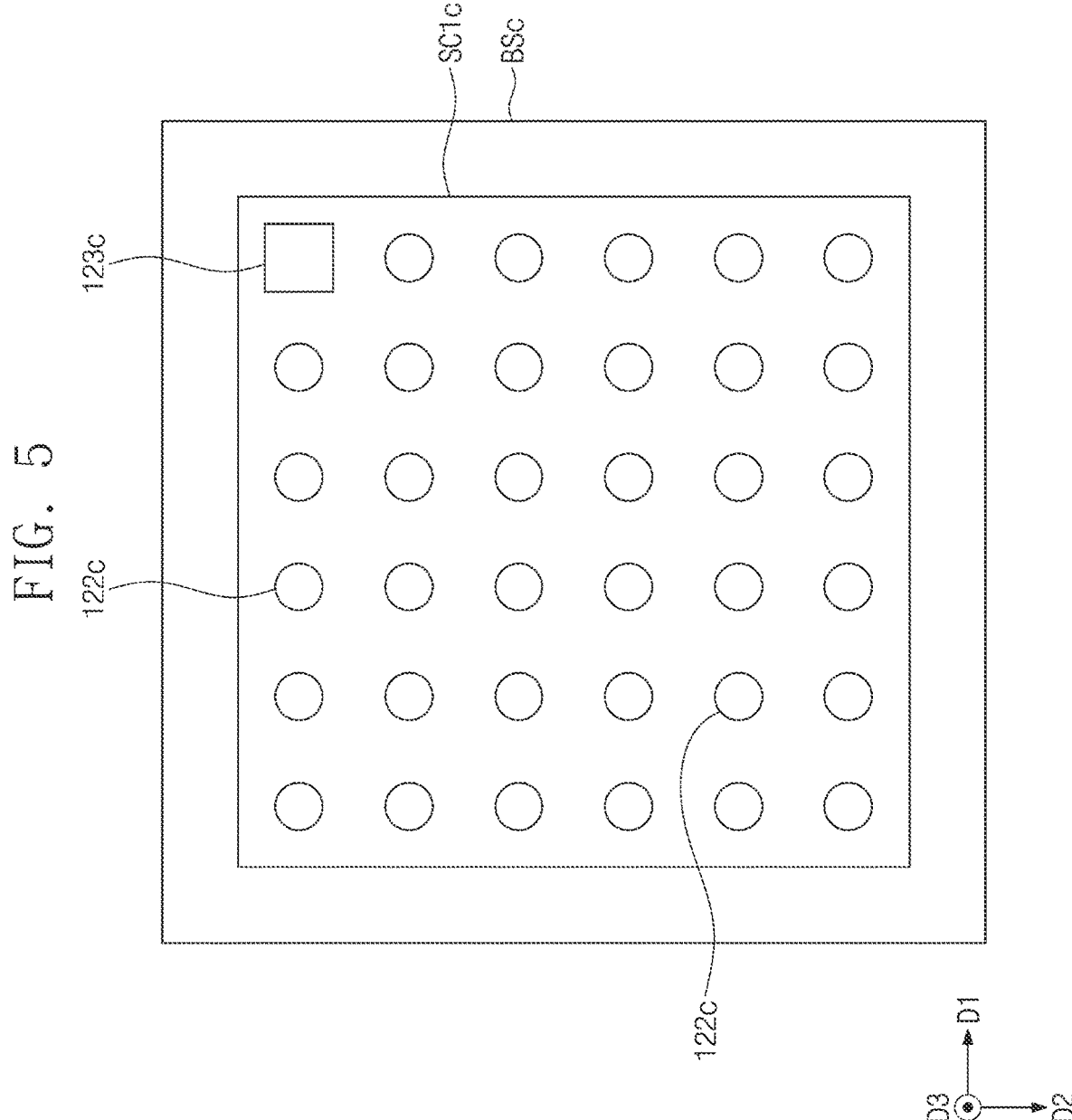
FIG. 5 is a plan view illustrating an example of a semiconductor device.

FIG. 5 is a plan view illustrating an example of a semiconductor device.

Referring to FIG. 5, a semiconductor device may include a base structure BSc and a first semiconductor chip SC1c on the base structure BSc.

The first semiconductor chip SC1c may include bonding pads 122c and a test pad 123c. A shape of the test pad 123c may be different from shapes of the bonding pads 122c. A planar shape of the test pad 123c may be a polygonal shape. For example, the planar shape of the test pad 123c may be a tetragonal shape, and planar shapes of the bonding pads 122c may be circular shapes.

In some implementations, the planar shapes of the test pad 123c and the bonding pads 122c may be rectangular shapes.

The base structure BSc may include bonding pads and a test pad, which have shapes corresponding to the shapes of the bonding pads 122c and the test pad 123c of the first semiconductor chip SC1c.

Figure 6:
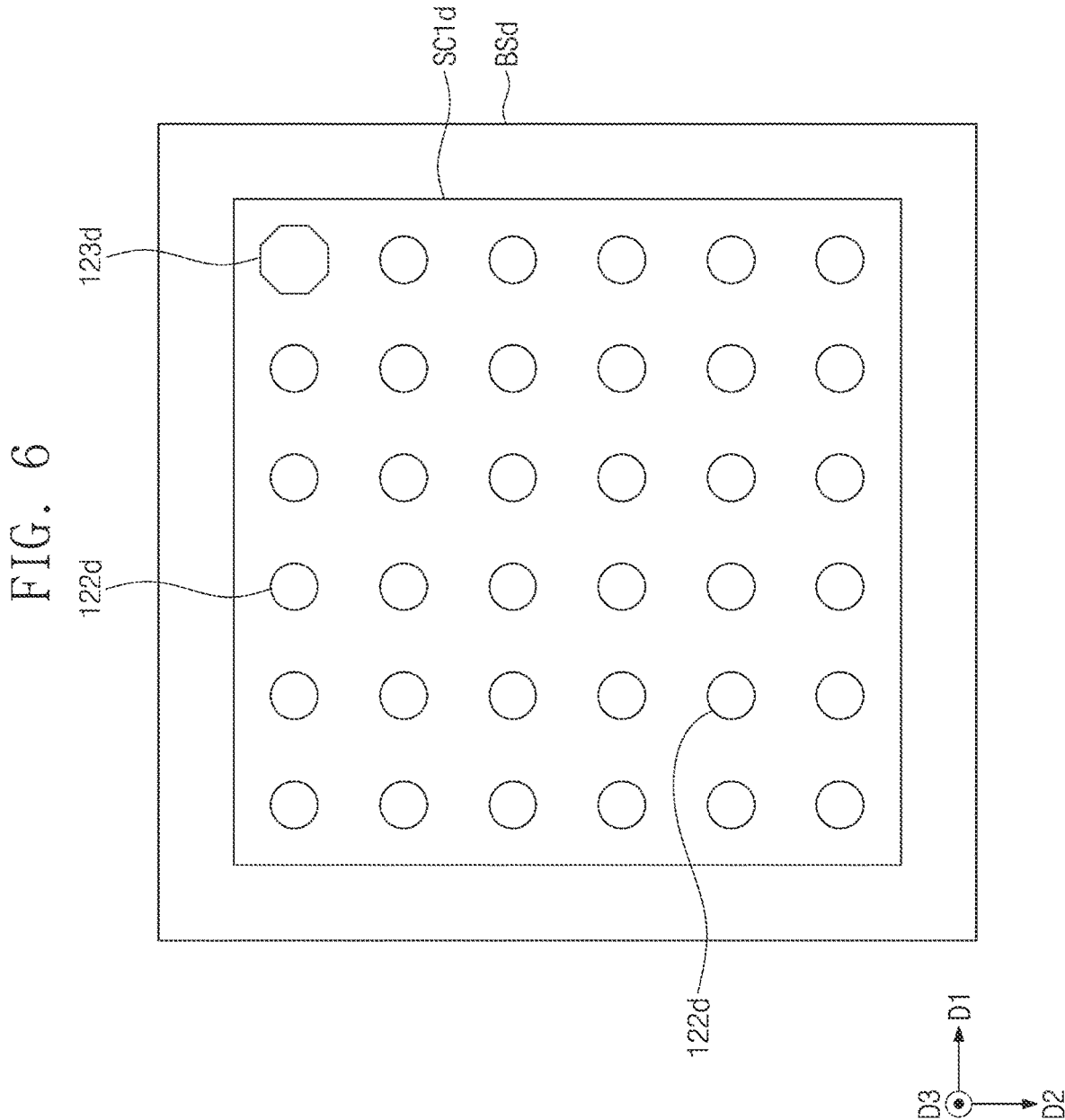
FIG. 6 is a plan view illustrating an example of a semiconductor device.

FIG. 6 is a plan view illustrating an example of a semiconductor device.

Referring to FIG. 6, a semiconductor device may include a base structure BSd and a first semiconductor chip SC1d on the base structure BSd.

The first semiconductor chip SC1d may include bonding pads 122d and a test pad 123d. A shape of the test pad 123d may be different from shapes of the bonding pads 122d. For example, a planar shape of the test pad 123d may be an octagonal shape, and planar shapes of the bonding pads 122d may be circular shapes.

In some implementations, the planar shapes of the test pad 123d and the bonding pads 122d may be octagonal shapes.

The base structure BSd may include bonding pads and a test pad, which have shapes corresponding to the shapes of the bonding pads 122d and the test pad 123d of the first semiconductor chip SC1d.

Figure 7:
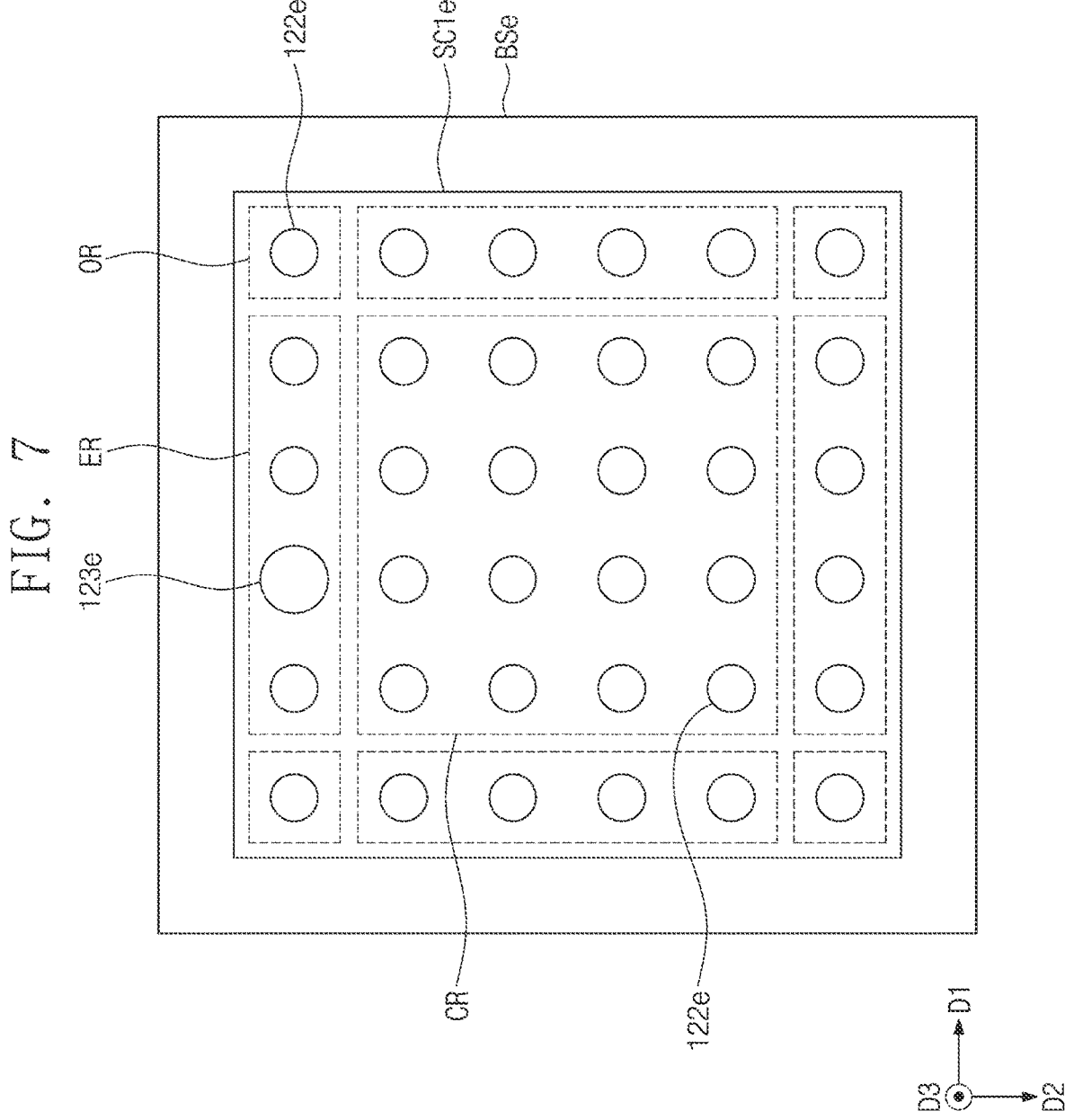
FIG. 7 is a plan view illustrating an example of a semiconductor device.

FIG. 7 is a plan view illustrating an example of a semiconductor device.

Referring to FIG. 7, a semiconductor device may include a base structure BSe and a first semiconductor chip SC1e on the base structure BSe.

The first semiconductor chip SC1e may include bonding pads 122e and a test pad 123e. The bonding pads 122e may be disposed in the corner regions OR, the edge regions ER and the center region CR. The test pad 123e may be disposed in the edge region ER.

The base structure BSd may include bonding pads and a test pad, which are disposed at positions corresponding to positions of the bonding pads 122e and the test pad 123e of the first semiconductor chip SC1d.

In some implementations, a plurality of the test pads 123e may be provided, and the test pads 123e may be disposed in the edge region ER and the corner region OR.

Figure 8:
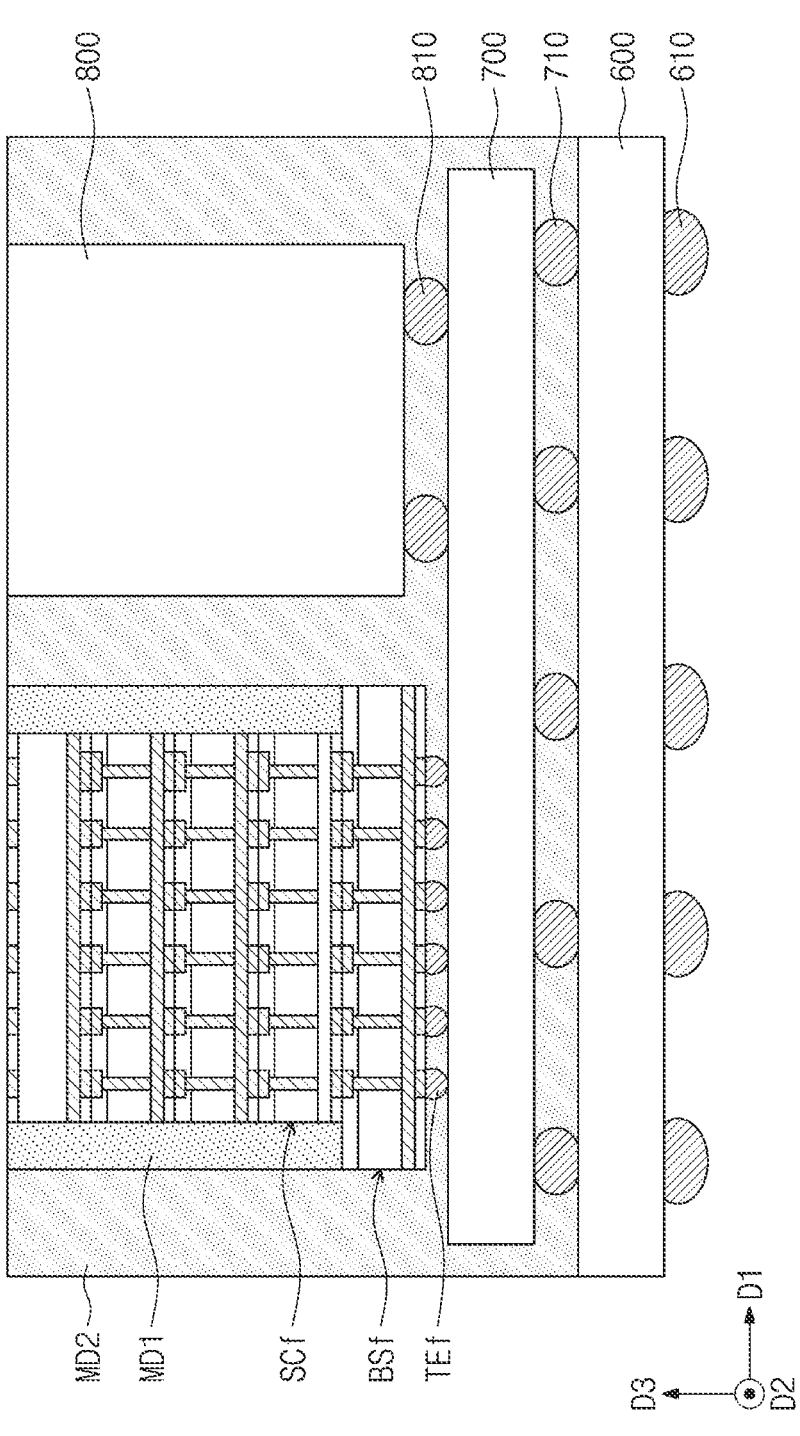
FIG. 8 is a cross-sectional view illustrating an example of a semiconductor device.

FIG. 8 is a cross-sectional view illustrating an example of a semiconductor device.

Referring to FIG. 8, a semiconductor device may include a package substrate 600.

For example, the package substrate 600 may be a printed circuit board (PCB). First terminals 610 electrically connected to the package substrate 600 may be provided. The semiconductor device may be mounted on an external device (e.g., a main board) through the first terminals 610.

An interposer 700 may be provided on the package substrate 600. Second terminals 710 electrically connecting the package substrate 600 and the interposer 700 may be provided. The second terminals 710 may be provided between the package substrate 600 and the interposer 700.

A processor chip 800 may be provided on the interposer 700. For example, the processor chip 800 may be a graphics processing unit (GPU) or a central processing unit (CPU). Third terminals 810 electrically connecting the processor chip 800 and the interposer 700 may be provided. The third terminals 810 may be provided between the processor chip 800 and the interposer 700.

A base structure BSf and semiconductor chips SCf may be provided on the interposer 700. The base structure BSf and the semiconductor chips SCf may be spaced apart from the processor chip 800 in the first direction D1. Fourth terminals TEf electrically connecting the base structure BSf and the interposer 700 may be provided. The fourth terminals TEf may be provided between the base structure BSf and the interposer 700. A first molding layer MD1 surrounding the base structure BSf and the semiconductor chips SCf may be provided.

A second molding layer MD2 surrounding the interposer 700, the processor chip 800, the base structure BSf and the semiconductor chips SCf may be provided on the package substrate 600.

Figure 9:
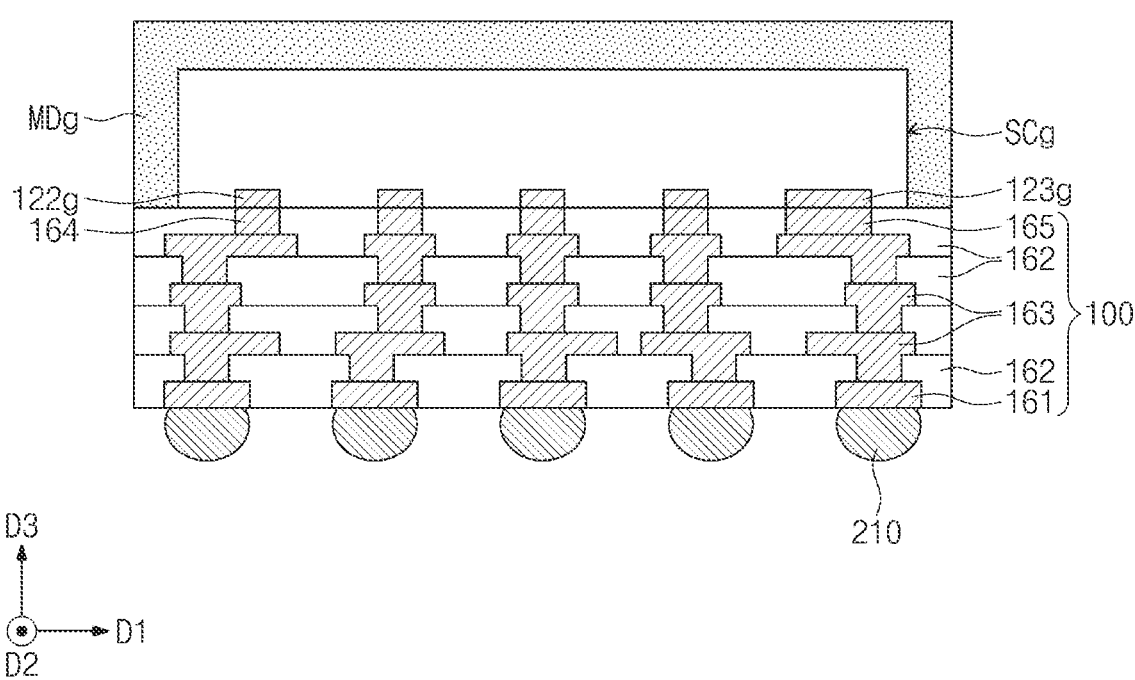
FIG. 9 is a cross-sectional view illustrating an example of a semiconductor device.

FIG. 9 is a cross-sectional view illustrating an example of a semiconductor device.

Referring to FIG. 9, a semiconductor device may include a redistribution substrate 100, terminals 210, a semiconductor chip SCg, and a molding layer MDg.

The redistribution substrate 100 may include under bump patterns 161, insulating layers 162, redistribution patterns 163, first bonding pads 164, and a first test pad 165. For example, the insulating layers 162 may include an organic material such as a photosensitive insulating material (e.g., a photo-imageable dielectric (PID) material). For example, the photosensitive insulating material may include at least one of photosensitive polyimide, polybenzoxazole, a phenol-based polymer, or a benzocyclobutene-based polymer.

The under bump patterns 161 may be disposed in a lowermost insulating layer 162 of the insulating layers 162. The terminal 210 may be connected to the under bump pattern 161. The terminal 210 and the under bump pattern 161 may include a conductive material.

The redistribution patterns 163 may be provided in the insulating layers 162. The redistribution pattern 163 may be electrically connected to the under bump pattern 161. Each of lowermost redistribution patterns 163 of the redistribution patterns 163 may be connected to the under bump pattern 161. The redistribution patterns 163 may include a conductive material. The redistribution pattern 163 may include a via portion for vertical connection and an interconnection portion for horizontal connection.

The first bonding pads 164 may be provided in an uppermost insulating layer 162 of the insulating layers 162. The first bonding pad 164 may be connected to an uppermost redistribution pattern 163 of the redistribution patterns 163. The first test pad 165 may be provided in the uppermost insulating layer 162 of the insulating layers 162. The first test pad 165 may be connected to an uppermost redistribution pattern 163 of the redistribution patterns 163. A width of the first test pad 165 may be greater than a width of the first bonding pad 164.

The semiconductor chip SCg may be provided on the redistribution substrate 100. An insulating structure of the semiconductor chip SCg may be in contact with the uppermost insulating layer 162 of the redistribution substrate 100. The semiconductor chip SCg may include second bonding pads 122g connected to the first bonding pads 164, and a second test pad 123g connected to the first test pad 165. A width of the second test pad 123g may be greater than a width of the second bonding pad 122g.

The molding layer MDg may be disposed on the redistribution substrate 100 to surround the semiconductor chip SCg.

Figure 10:
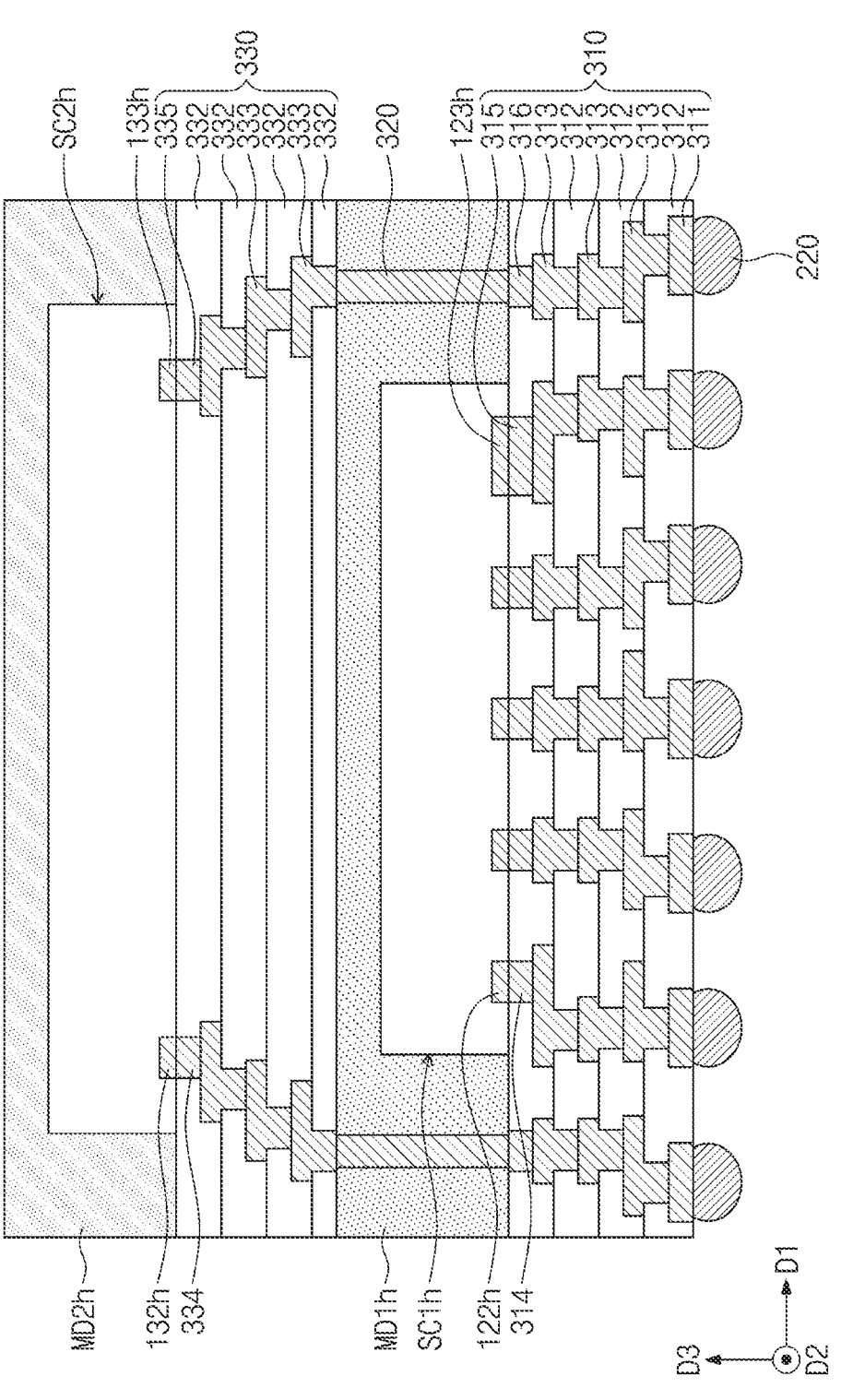
FIG. 10 is a cross-sectional view illustrating an example of a semiconductor device.

FIG. 10 is a cross-sectional view illustrating an example of a semiconductor device.

Referring to FIG. 10, a semiconductor device may include a first redistribution substrate 310, terminals 220, a first semiconductor chip SC1*h*, a first molding layer MD1*h*, connection vias 320, a second redistribution substrate 330, a second semiconductor chip SC2*h*, and a second molding layer MD2*h*.

The first redistribution substrate 310 may include under bump patterns 311, first insulating layers 312, first redistribution patterns 313, first bonding pads 314, a first test pad 315, and connection pads 316.

The connection pads 316 may be disposed in an uppermost first insulating layer 312 of the first insulating layers 312. The connection pads 316 may include a conductive material.

The first semiconductor chip SC1*h* may be provided on the first redistribution substrate 310. An insulating structure of the first semiconductor chip SC1*h* may be in contact with the uppermost first insulating layer 312 of the first redistribution substrate 310. The first semiconductor chip SC1*h* may include second bonding pads 122h connected to the first bonding pads 314, and a second test pad 123h connected to the first test pad 315.

The first molding layer MD1*h* may be provided on the first redistribution substrate 310 to surround the first semiconductor chip SC1*h*. The connection vias 320 may penetrate the first molding layer MD1*h*. The connection via 320 may be connected to the connection pad 316. The connection vias 320 may include a conductive material.

The second redistribution substrate 330 may be provided on the first molding layer MD1*h*. The second redistribution substrate 330 may include second insulating layers 332, second redistribution patterns 333, a third bonding pad 334, and a third test pad 335. Each of lowermost second redistribution patterns 333 of the second redistribution patterns 333 of the second redistribution substrate 330 may be connected to the connection via 320.

The second semiconductor chip SC2*h* may be provided on the second redistribution substrate 330. An insulating structure of the second semiconductor chip SC2*h* may be in contact with an uppermost second insulating layer 332 of the second redistribution substrate 330. The second semiconductor chip SC2*h* may include a fourth bonding pad 132h connected to the third bonding pad 334, and a fourth test pad 133h connected to the third test pad 335. The second molding layer MD2*h* may be provided on the second redistribution substrate 330 to surround the second semiconductor chip SC2*h*.

Figure 11:
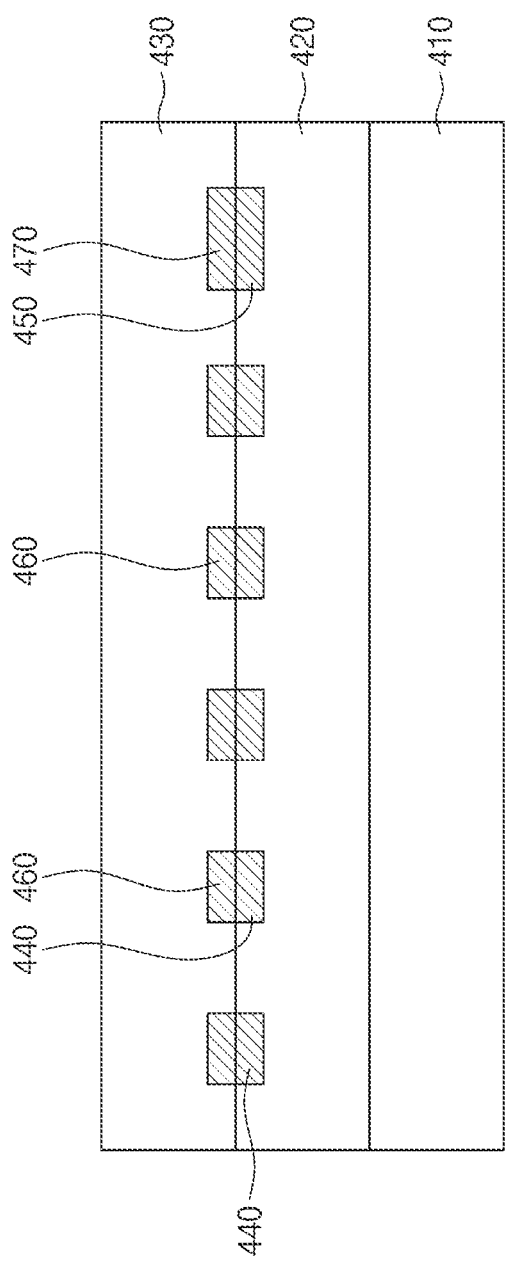
FIG. 11 is a cross-sectional view illustrating an example of a semiconductor device.
Figure 11:
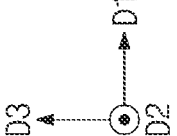

FIG. 11 is a cross-sectional view illustrating an example of a semiconductor device.

Referring to FIG. 11, a semiconductor device may include a substrate 410, a first insulating structure 420 on the substrate 410, a second insulating structure 430 on the first insulating structure 420, first bonding pads 440 in the first insulating structure 420, a first test pad 450 in the first insulating structure 420, second bonding pads 460 in the second insulating structure 430, and a second test pad 470 in the second insulating structure 430.

The substrate 410 may be a semiconductor substrate. The first insulating structure 420 may be provided on the substrate 410. A semiconductor element may be provided between the substrate 410 and the first insulating structure 420. For example, the semiconductor element may be a logic element, a memory element, or an image sensor element.

The first bonding pads 440 and the first test pad 450 may be provided in the first insulating structure 420. A width of the first test pad 450 may be greater than a width of the first bonding pad 440. The first bonding pad 440 may be electrically connected to the semiconductor element through a first conductive structure in the first insulating structure 420. For example, the first conductive structure may include at least one of a conductive contact, a conductive line, or a conductive pad.

The second bonding pads 460 and the second test pad 470 may be provided in the second insulating structure 430. A width of the second test pad 470 may be greater than a width of the second bonding pad 460.

In some implementations. the second bonding pad 460 may be electrically connected to a second conductive structure in the second insulating structure 430.

The second bonding pad 460 may be bonded to the first bonding pad 440. The second test pad 470 may be bonded to the first test pad 450. An air gap may be provided between the second test pad 470 and the first test pad 450.

The semiconductor device may include the test pads having relatively great widths, and thus the bonding quality of the bonding pads may be improved.

While examples have been particularly shown and described, it will be understood by one of ordinary skill in the art that variations in form and detail may be made therein without departing from the spirit and scope of the attached claims.

What is claimed is:

1. A semiconductor device comprising:
   a base structure comprising a first bonding pad and a first test pad spaced apart in a first direction; and
   a semiconductor chip comprising a second bonding pad in contact with the first bonding pad of the base structure, and a second test pad in direct contact with the first test pad of the base structure, wherein:
   a portion of a surface of the first test pad is exposed,
   a portion of a surface of the second test pad is exposed, and
   the exposed portion of the surface of the first test pad and the exposed portion of the surface of the second test pad define an air gap between the first test pad of the base structure and the second test pad of the semiconductor chip, and
   wherein a width along the first direction of the second bonding pad of the semiconductor chip is less than a width along the first direction of the second test pad of the semiconductor chip.

2. The semiconductor device of claim 1, wherein a width along the first direction of the first bonding pad of the base structure is less than a width along the first direction of the first test pad of the base structure.

3. The semiconductor device of claim 1, wherein the semiconductor chip includes a center region and a surrounding region that surrounds the center region,
   wherein the second bonding pad of the semiconductor chip is disposed in the center region of the semiconductor chip, and
   wherein the second test pad of the semiconductor chip is disposed in the surrounding region of the semiconductor chip.

4. The semiconductor device of claim 1, wherein the second test pad of the semiconductor chip is closer to a side surface of the semiconductor chip than the second bonding pad of the semiconductor chip.

5. The semiconductor device of claim 1, wherein:

another portion of the surface of first test pad, different from the exposed portion of the surface of the first test pad, is in contact with the second test pad, another portion of the surface of the second test pad, different from the exposed portion of the surface of the second test pad, is in contact with the first test pad, wherein the other portions of the surfaces of the first and second test pads form a contact surface between the first and second test pads, and wherein the air gap is located between the contact surface and a side surface of the second test pad of the semiconductor chip.

6. The semiconductor device of claim 5, wherein the air gap borders the contact surface.

7. The semiconductor device of claim 5, wherein a height of an uppermost portion of the air gap is higher than a height of the contact surface, and wherein a height of a lowermost portion of the air gap is lower than the height of the contact surface, wherein the heights are along a second direction, perpendicular to the first direction.

8. The semiconductor device of claim 1, wherein the second test pad of the semiconductor chip comprises: a conductive layer; and a barrier layer partially surrounding the conductive layer, and wherein the air gap exposes a bottom surface of the barrier layer of the second test pad of the semiconductor chip.

9. A semiconductor device comprising:

a base structure comprising a first bonding pad and a first test pad spaced apart in a first direction; and a semiconductor chip comprising a second bonding pad in contact with the first bonding pad of the base structure, and a second test pad in direct contact with the first test pad of the base structure, wherein a portion of a surface of the first test pad is exposed, wherein a portion of a surface of the second test pad is exposed, wherein the exposed portion of the surface of the first test pad and the exposed portion of the surface of the second test pad define an air gap between the first test pad of the base structure and the second test pad of the semiconductor chip, wherein a width along the first direction of the second bonding pad of the semiconductor chip is less than a width along the first direction of the second test pad of the semiconductor chip, wherein a width along the first direction of the first bonding pad of the base structure is less than a width along the first direction of the first test pad of the base structure.

10. The semiconductor device of claim 9, wherein:

another portion of the surface of first test pad, different from the exposed portion of the surface of the first test pad, is in contact with the second test pad, another portion of the surface of the second test pad, different from the exposed portion of the surface of the second test pad, is in contact with the first test pad, the other portions of the surfaces of the first and second test pads form a contact surface between the first and second test pads, and the air gap borders the contact surface.

11. The semiconductor device of claim 1, wherein a contact surface between the first test pad and the second test pad is flat.

12. The semiconductor device of claim 9, wherein a contact surface between the first test pad and the second test pad is flat.

* * * * *